(12) United States Patent
Jin et al.

(10) Patent No.: US 7,767,560 B2
(45) Date of Patent: Aug. 3, 2010

(54) THREE DIMENSIONAL STRAINED QUANTUM WELLS AND THREE DIMENSIONAL STRAINED SURFACE CHANNELS BY GE CONFINEMENT METHOD

(75) Inventors: Been-Yih Jin, Lake Oswego, OR (US);
Robert S. Chau, Beaverton, OR (US);
Brian S. Doyle, Portland, OR (US);
Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 270 days.

(21) Appl. No.: 11/864,963

(22) Filed: Sep. 29, 2007

(65) Prior Publication Data
US 2009/0085027 A1   Apr. 2, 2009

(51) Int. Cl.
*H01L 21/36* (2006.01)
*H01L 21/20* (2006.01)

(52) U.S. Cl. .............................. 438/494; 257/E21.103
(58) Field of Classification Search .................. 438/478, 438/494
See application file for complete search history.

(56) References Cited

U.S. PATENT DOCUMENTS

| | | | |
|---|---|---|---|
| 5,268,324 A | 12/1993 | Aitken et al. |
| 5,357,119 A | 10/1994 | Wang et al. |
| 5,792,679 A | 8/1998 | Nakato |
| 6,362,082 B1 | 3/2002 | Doyle et al. |
| 6,447,605 B1 | 9/2002 | Chung |
| 6,548,335 B1 | 4/2003 | Huster et al. |
| 6,548,842 B1 | 4/2003 | Bulucea et al. |
| 6,734,510 B2 | 5/2004 | Forbes et al. |
| 7,105,895 B2 | 9/2006 | Wang et al. |
| 7,109,516 B2 | 9/2006 | Langdo et al. |
| 7,198,995 B2 | 4/2007 | Chidambarrao et al. |
| 7,202,494 B2 | 4/2007 | Blanchard et al. |
| 7,226,832 B2 | 6/2007 | Yeo et al. |

(Continued)

OTHER PUBLICATIONS

H. Shang, et al., "Germanium channel MOSFETS: opportunities and challenges," IBM Journal of Research and Development, Jul./Sep. 2006, pp. 377-386, vol. 50, No. 4/5.

(Continued)

*Primary Examiner*—W. David Coleman
*Assistant Examiner*—Christine Enad
(74) *Attorney, Agent, or Firm*—Grossman, Tucker, Perreault & Pfleger, PLLC

(57) ABSTRACT

The present disclosure describes a method and apparatus for implementing a 3D (three dimensional) strained high mobility quantum well structure, and a 3D strained surface channel structure through a Ge confinement method. One exemplary apparatus may include a first graded SiGe fin on a Si substrate. The first graded SiGe fin may have a maximum Ge concentration greater than about 60%. A Ge quantum well may be on the first graded SiGe fin and a SiGe quantum well upper barrier layer may be on the Ge quantum well. The exemplary apparatus may further include a second graded SiGe fin on the Si substrate. The second graded SiGe fin may have a maximum Ge concentration less than about 40%. A Si active channel layer may be on the second graded SiGe fin. Other high mobility materials such as III-V semiconductors may be used as the active channel materials. Of course, many alternatives, variations and modifications are possible without departing from this embodiment.

9 Claims, 5 Drawing Sheets

U.S. PATENT DOCUMENTS

| | | | |
|---|---|---|---|
| 7,227,176 | B2 | 6/2007 | Wu et al. |
| 7,235,436 | B1 | 6/2007 | Lin et al. |
| 7,235,497 | B2 | 6/2007 | Powell |
| 7,238,595 | B2 | 7/2007 | Brabant et al. |
| 7,256,077 | B2 | 8/2007 | Orlowski |
| 7,514,739 | B2 * | 4/2009 | Park et al. .................. 257/315 |
| 7,592,686 | B2 * | 9/2009 | Jang et al. .................. 257/618 |
| 2003/0015749 | A1 | 1/2003 | Zielbauer |
| 2005/0130358 | A1 | 6/2005 | Chidambarrao et al. |
| 2006/0014331 | A1 | 1/2006 | Tang et al. |
| 2006/0121678 | A1 | 6/2006 | Brask et al. |
| 2007/0063182 | A1 | 3/2007 | Yang et al. |
| 2007/0123008 | A1 | 5/2007 | Xie et al. |
| 2007/0134878 | A1 | 6/2007 | Brask et al. |
| 2007/0138565 | A1 | 6/2007 | Datta et al. |
| 2007/0155063 | A1 | 7/2007 | Datta et al. |

OTHER PUBLICATIONS

D.A. Antoniadis, et al., "Continuous MOSFET performance increase with device scaling: the role of strain and channel material innovations," IBM Journal of Research and Development, Jul./Sep. 2006, pp. 363-376A, vol. 50, No. 4/5.

Mike Seacrist, "Silicon starting materials for sub-65nm technology nodes," Jun. 2005, available at: http://www.memc.com/PDF_Files/Key_Topics_PDF_Folder/SCP-Symposium-Seacrist.pdf.

Jack Kavalieros, et al, "Tri-gate transistor architecture with high-k gate dielectrics, metal gates, and strain engineering," Jun. 2006, available at: ftp://download.intel.com/technology/silicon/tri-gate_paper_VLSI_0606.pdf.

Helmut Foll,"Isotype junctions, modulation doping, and quantum effects," available at http://www.tf.uni-kiel.de/matwis/amat/semi_en/kap_5/backbone/r5_3_2.html, as seen Aug. 3, 2007.

C.L. Chang, et al, "Direct optical measurement of the valence band offset of p1 Si1-x-yGexCy /p- Si(100) by heterojunction internal photoemission," Princeton University Applied Physics Letters, Dec. 1998, vol. 73, No. 24.

S.B. Zhang, et al., "Quasiparticle calculation of valence band offset of auas-gaas (001)" Solid State Communications, 1988, pp. 585-588, vol. 66, No. 6, available at http://www.pa.msu.edu/cmp/csc/eprint/DT030.pdf, Jan. 1988.

Luigi Colombo, et al., "Integration of High-k Gate Dielectrics and Dual Work Function Metal Gate Electrodes," Future Fab International Magazine, Jan. 2005, Issue 18.

David Lammers, "IBM adds hot sauce to carrier mobility recipe," EETimes, Jun. 2004, available at http://www.eetimes.com/article/showArticle.jhtml?articleID=22100781.

"Intel tri-gate transistors will enable a new era in energy-efficient performance," available at http://www.intel.com/technology/silicon/tri-gate-demonstrated.htm, as seen Aug. 14, 2007.

Robert S. Chau, "Integrated cmos tri-gate transistors: paving the way to future technology generations," Aug. 2006, available at http://www.intel.com/technology/magazine/silicon/tri-gate-transistors-0806.htm.

David P. Brunco, "Germanium: the past and possibly a future material for microelectronics," available at http://ecsmeet6.peerx-press.org/ms_files/ecsmeet6/2007/05/21/00002087/00/2087_0_art_0_jiedii.pdf, as seen May 2007.

Z.Y. Fan, et al., "Delta-Doped AlGaN/GaN Heterostructure Field-Effect Transistors With Incorporation of AlN Epilayers," Materials Gateway Research, available at http://www.mrs.org/s_mrs/sec_subscribe.asp? CID=2640&DID=117211&action=detail, as seen Aug. 2007.

D C Ahlgren, et al., "SiGe Comes of Age in the Semiconductor Industry," Future Fab International., Jul. 2002, Issue 13.

G.Pourtois, et al., "A step towards a better understanding of silicon passivated (100)Ge p-channel devices," Abstract #558, 211th ECS Meeting, May 6, 2007-May 10, 2007, Chicago, Illinois, available at http://www.ecsdl.org/getpdf/servlet/GetPDFServlet?filetype=pdf&id=MAECES000701000012000558000001&idtype=cvips.

Mayank Bulsara, "Roadmap requirements for emerging materials," Solid State Technology, Jan. 2006, Available At http://sst.pennnet.com/display_article/245013/5/ARTCL/none/none/1/Roadmap-requirements-for-emerging-materials/.

F.G. Johnson, et al., "Native oxide formation technique for Group III-V semiconductor device fabrication that enhances the oxidation rate," National Security Agency, available at http://www.nsa.gov/techtrans/techt00017.cfm, as seen Jul. 2007.

Chris Mack, "Semiconductor Lithography—The Basic Process," available at http://www.lithoguru.com/scientist/lithobasics.html, as seen Aug. 2007.

"Deposition Processes- MEMS Thin Films Deposition Processes" available at https://www.memsnet.org/mems/processes/deposition.html, as seen Sep. 2007.

Brendan Foran, et al., "Strain Measurement by Transmission Electron Microscopy," Future Fab International, Jan. 2006, vol. 20, available at http://www.future-fab.com/documents.asp?d_ID=3711.

Prof. Krishina Saraswat, "EE410 vs. Advanced CMOS Structures," Department of Electrical Engineering, Stanford University, available at http://www.stanford.edu/class/ee410/AdvCMOS.pdf.

Katherine Derbyshire, "The Engineered Substrate's Balancing Act: Performance Gains versus Greater Costs and Increased Yield Risks," Yield Management Solutions Magazine, Summer 2004: vol. 6, Issue 2, pp. 25-31, Jul. 2004.

* cited by examiner

THREE DIMENSIONAL STRAINED QUANTUM WELLS AND THREE DIMENSIONAL STRAINED SURFACE CHANNELS BY GE CONFINEMENT METHOD

FIELD

The present disclosure describes a method and apparatus for implementing a 3D (three dimensional) strained high mobility quantum well structure, and a 3D strained surface channel structure through a Ge confinement method that may be used for Complementary Metal Oxide Semiconductors.

BRIEF DESCRIPTION OF DRAWINGS

Features and advantages of the claimed subject matter will be apparent from the following detailed description of embodiments consistent therewith, which description should be considered with reference to the accompanying drawings, wherein:

Figure 1A:
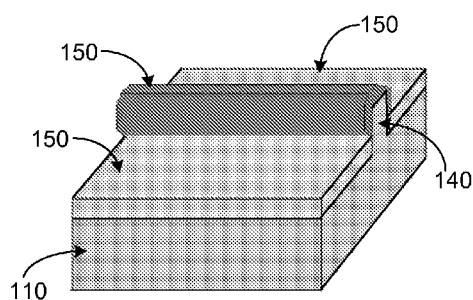
FIGS. 1A through 1D illustrate exemplary steps in the formation of a SiGe (Silicon-Germanium) structure, consistent with the present disclosure.

Although the following Detailed Description will proceed with reference being made to illustrative embodiments, many alternatives, modifications, and variations thereof will be apparent to those skilled in the art.

DETAILED DESCRIPTION

Generally, this disclosure describes a method for forming, and an apparatus having, a strain inducing $Si_{1-x}Ge_x$ 3D (three dimensional) fin. This disclosure further describes a method for forming, and an apparatus having, a strained 3D active channel structure or structures on the strain inducing fin. The strained 3D active channel structures may include a quantum well and/or a strained 3D surface channel. The $Si_{1-x}Ge_x$ 3D fin may be self-graded. The method may include Ge (Germanium) confinement. The method may further include selective Si (Silicon) oxidation. The 3D quantum well and 3D surface channel may be generally strained in a uniaxial direction substantially parallel to a long fin direction and may be generally relaxed in the perpendicular directions.

A quantum well structure may be understood to be a relatively high carrier mobility, narrow band gap material channel, sandwiched between two wider band gap semiconductor material layers. Band gap widths may be related to conducting and/or insulating properties of materials. Wider band gaps may correspond to materials with insulating properties while smaller band gaps may correspond to materials that act more like conductors. The wider band gap material layers may confine the carriers to the quantum well. The carriers may then move relatively more easily within the well.

Relatively low power consumption and relatively high saturation current (IDSAT) may be important performance parameters for logic devices. Relatively high performance logic devices may include CMOS (complementary metal oxide semiconductor) transistor structures. Each CMOS transistor structure may include a pMOS transistor and an nMOS transistor. In a CMOS transistor structure, only the pMOS transistor or only the nMOS transistor may be in its ON state during a switching cycle. Each nMOS and each pMOS transistor may dissipate power only in its respective ON state. As a result, a CMOS transistor structure may have the advantage of relatively low power consumption.

With respect to saturation current, IDSAT, reducing gate length, Lg, may improve the current drive performance of a CMOS transistor structure, i.e., may increase IDSAT. However, reducing the gate length, Lg, may worsen undesirable short channel effects (SCE). Short channel effects may include increased subthreshold current and variation in threshold voltage, $V_T$, (e.g., $V_T$ roll off) that may be caused by drain induced barrier lowering (DIBL). Short channel effects may be reduced by using a relatively high dielectric constant gate insulator. Such a gate insulator may be thicker and may maintain a relatively low gate leakage current.

The CMOS transistor structures may be planar devices or may be three dimensional devices (i.e., may include a vertical dimension). Three dimensional devices may include fin-shaped structures that may include one or more drains, sources and/or active channels. The three dimensional devices may further include a gate structure that may contact the fin structure on one or more surfaces. Accordingly, the gate structure may include a trigate structure that may contact the fin structure on three surfaces. The trigate structure may provide improved electrostatic control of the channel on/off and may thereby reduce short channel effects.

Charge carrier mobility may affect the switching speed and drive current of a device. As used in semiconductor arts, charge carriers may be understood to include electrons and holes. Higher carrier mobility may correspond to a higher switching speed and higher drive current for an equivalent supply voltage, and may thereby provide faster device performance. Alternatively, a device may be operated at a lower supply voltage that may result in reduced device power dissipation.

High hole mobility may be desirable for pMOS devices and high electron mobility may be desirable for nMOS devices. Carrier mobility may be increased through, for example, device material selection, carrier confinement, doping method and/or strain engineering. For example, relatively higher mobility materials such as strained Si, strained SiGe and III-V materials may be used to improve CMOS speed and IDSAT performance.

In one embodiment, a relatively high mobility channel may be formed of high mobility materials such as group IV materials (e.g., SiGe, Ge) or III-V materials (e.g., GaAs (Gallium Arsenide), InSb (Indium Antimonide), InGaAs (Indium Gallium Arsenide)) that may also be strained. Carrier mobility may be further enhanced by reducing surface scattering (i.e., carrier confined in well), reducing impurity scattering (e.g., by remote delta doping), and reducing source/drain to junction leakage (due to smaller source/drain to channel interfaces with thin quantum well channel confinement).

For example, Ge may have a higher bulk hole mobility (about 1900 $cm^2$/V-s at 300° K) than Si (about 500 $cm^2$/V-s at 300° K). As used herein, "about" may be understood to mean within ±10%. It may therefore be desirable to implement a Ge active channel in a pMOS device. Although Ge may have a higher electron mobility than Si (about 3900 $cm^2$/V-s at 300°

K for Ge versus about 1450 cm$^2$/V-s at 300° K for Si), it may be difficult to implement a Ge active channel in an nMOS device. Ge may have a relatively poor n-type dopant incorporation and activation and Ge may also experience relatively fast n-type dopant diffusion. Accordingly, strained Si or high electron mobility III-V materials such as GaAs (Gallium Arsenide), InSb (Indium Antimonide), and InGaAs (Indium Gallium Arsenide), may be more desirable nMOS active channel materials.

Hole mobility may be increased through compressive strain in a pMOS active channel. For example, in planar devices, an about 2% compressive strain in a Ge pMOS active channel may yield a hole mobility that is about 2.5 times its unstrained hole mobility and about 7 to about 9 times higher than hole mobility in a Si channel. Similarly, electron mobility may be increased through tensile strain in an nMOS active channel. For example, an about 1% tensile strain in a Si nMOS active channel may yield an electron mobility that is about 1.8 times higher than its unstrained electron mobility.

Strain may be a function of material lattice structures. A first layer may have an inherent lattice structure that differs from an inherent lattice structure of an adjacent layer or layers. The first layer may be strained when its lattice structure is constrained in at least one dimension to match the lattice structure of the adjacent layer or layers. The magnitude of the strain may be related to the thickness of the strained first layer and the magnitude of the lattice mismatch between the strained first layer and the adjacent strain inducing layer or layers.

At a thickness less than a critical thickness, a strained layer may maintain its strained lattice structure, i.e., the lattice of the strained layer may maintain its coherence with the adjacent layer strain inducing or layers. The magnitude of the critical thickness may be temperature dependent and may also depend on the magnitude of the lattice mismatch between the strained layer and the adjacent layer or layers. For example, the critical thickness may decrease as the temperature and/or the lattice mismatch increases.

At a thickness greater than the critical thickness, the strained layer may relax to its inherent lattice structure. In other words, a relaxed layer may no longer be strained. The strained layer may relax through the generation of dislocation defects. A planar strain-relaxed layer may have a rough surface that may be due, at least in part, to dislocation defects. A three-dimensional strained layer (e.g., a fin structure) may produce relatively fewer dislocation defects because such defects terminate at the edges and corners of a nonplanar structure. Such edges and corners may provide more surface area to accommodate lattice mismatch between a strain inducing layer and a strained layer. Surface roughness may be further smoothed by selection of process conditions, e.g., a relatively high temperature preferential Si oxidation process.

Accordingly, an active channel may be strained by forming the active channel layer having a first lattice constant on a strain inducing layer or layers having a different lattice constant. As used herein, "layer" may include both planar structures as well as three dimensional structures such as fin structures that will be discussed in more detail below. However, relatively mismatched lattice constants may correspond to significant differences in lattice structures. Significant differences in lattice structures between a strained layer and an adjacent strain inducing layer may result in defects, e.g., dislocations, that may degrade the operation of a semiconductor device.

For example, Si may have a lattice constant of about 5.431 Å (Angstroms) and Ge may have a lattice constant of about 5.658 Å. Si and Ge may be considered to have relatively mismatched lattice constants with a difference of about 4%. Because of the magnitude of this lattice mismatch, forming adjacent layers of Si and Ge may result in defects, e.g., dislocations, at an interface and such defects may extend into a layer or layers. Defects, such as threading dislocation defects that may terminate at the surface, may cause surface roughness in planar devices. Surface roughness may degrade the operation of such a device.

Accordingly, it may be desirable to strain a Si or Ge active channel layer with a strain inducing alloy layer (e.g., with an alloy of Si and Ge) in order to reduce the lattice mismatch between the active channel layer and the strain inducing layer. A reduced lattice mismatch may yield fewer defects. The magnitude of the lattice mismatch and the magnitude of the strain in active layer may then be adjusted by adjusting the relative concentrations of Si and Ge in the strain inducing layer.

Further, Si may be a relatively more common substrate in semiconductor fabrication. Si may be relatively less expensive and may be available in relatively large diameter (e.g., 300 mm or more) ingots and wafers. For example, a relatively high hole mobility active channel (e.g., p-channel Ge quantum well) may be integrated with a relatively high electron mobility active channel (e.g., n-channel strained Si active channel) on a Si substrate. The integrated p-channel and n-channel devices may then be useful for high speed, low power CMOS applications.

In addition to lattice mismatch between a strained active channel layer and a strain inducing layer, lattice mismatch between a substrate (e.g., Si) and an adjacent layer or layers may also result in defects, e.g., threading dislocations. Such defects may degrade device operation and/or may lead to device failure. It may therefore be desirable to provide a transition in lattice constant between the substrate and the adjacent layer or layers. A transition region may have a planar shape for planar structures and may have a three dimensional fin shape for three dimensional structures.

The transition may be provided by gradually changing the relative concentrations of a substrate material (e.g., Si) and an active channel layer material (e.g., Ge) or another material having one or more desired properties, e.g., lattice constant. The rate of change may be constant or variable, continuous or discontinuous. For example, Si concentration in a transition region (e.g., 3D fin or planar) between a Si substrate and a Ge active channel may be greater near the Si substrate than near the Ge active channel. Likewise, Ge concentration in the transition region may be greater near the Ge active channel than near the Si substrate.

A layer that includes more than one material may be "graded." The grading may be provided by sequentially growing multiple layers of materials having different relative concentrations. For example, for Si and Ge, for each layer, the concentration of Si may decrease by an amount and the concentration of Ge may increase by that amount. The amount may be determined by the number of layers, the grading rate (e.g., percent increase per unit layer thickness), and/or the desired final relative concentrations of the boundary layers. The amount may vary between the layers. As noted above, "layer" as used herein, includes both planar and three dimensional (e.g., fin) structures.

In another embodiment, the grading may be "self-graded". Self-grading may be implemented through selection of process steps and process conditions. For example, a self-graded layer, where the concentrations of materials A and B may vary continuously over the layer, may be formed as follows. Beginning with a first layer of material A, for example, a second layer, having uniform concentrations of materials A and B, may be grown on the first layer. Through selection of process step or steps and process condition or conditions, material B from the second layer may then be forced into the first layer. Variations in relative concentrations of materials A and B over the first layer may then be continuous rather than discrete. Any remaining second layer may then be removed.

In this embodiment, there may be one layer with final self-graded relative concentrations of materials that may vary over the layer. This variation in relative concentrations of materials may be continuous. The resulting final relative concentrations of materials at the layer boundaries and their gradient or gradients over the layer may depend on the process steps and process conditions. Accordingly, a process may be defined to achieve desired relative concentrations of the layer materials at and/or near the layer boundaries. For example, a process may be defined to achieve a first transition region with a relatively large gradient over the region and a second adjacent region with a relatively small gradient over the region.

Figure 1B:
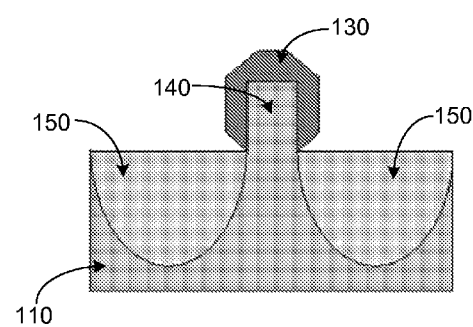

FIGS. 1A and 1B depict an example of a substrate 110 including a fin structure 140. The substrate 110 and fin structure 140 may be Si. The fin structure 140 may be formed on the substrate 110 using lithographic and etching techniques. For example, the region where the fin structure 140 is to be formed may be protected by photoresist and the adjacent regions may be etched away, leaving fin structure 140 and substrate 110. In an embodiment, the fin structure 140 may have a width in the range of about 20 nm (nanometers) to about 60 nm. The height of the fin structure 140 may be determined by device requirements and may be limited only by etching capabilities. In an embodiment, the fin structure 140 may have a height between about 40 nm and about 100 nm.

It may be appreciated that a Si substrate 110 may contain a plurality of fin structures 140. Steps for forming a plurality of pMOS transistor structures or a plurality of nMOS transistor structures may be performed on multiple fin structures 140 in parallel. A single fin structure 140 is shown for simplicity.

Layer 150 may then be formed on substrate 110 and fin structure 140. Layer 150 may be grown by plasma chemical vapor deposition (CVD) at relatively low temperatures and at relatively low pressures. In an embodiment, layer 150 may be grown by plasma CVD at temperatures in the range of about 400° C. to about 550° C. and at pressures less than about 100 torr. Layer 150 may be a deposited oxide, e.g., $SiO_2$. In an embodiment, layer 150 may be a shallow trench isolation oxide.

At least a portion of the fin structure 140 may then be exposed (i.e., bare surface in preparation for epitaxial growth of a strain inducing layer). It may be appreciated that the Si fin structure 140 may have multiple exposed surfaces. In an embodiment, layer 150 may be chemically and/or mechanically polished to a top surface of at least a portion of fin structure 140. Layer 150 may then be recessed adjacent both sides of fin structure 140 to a depth in the range of about 10 nm to about 60 nm. Accordingly, at least a portion of three surfaces of the fin structure 140 may be exposed in preparation for epitaxial growth of a strain inducing layer. A $Si_{1-x}Ge_x$ layer 130 may be epitaxially grown on the Si fin 140. The $Si_{1-x}Ge_x$ layer 130 may be grown on all exposed surfaces of Si fin 140. In an embodiment, the $Si_{1-x}Ge_x$ layer 130 may have a final thickness between about 20 nm and about 60 nm.

The value of x in the $Si_{1-x}Ge_x$ layer 130 may be selected to achieve a desired strain in an active channel layer. The value of x may therefore depend on the desired strain and the materials selected for the active channel layer. The value of x may further depend on whether pMOS or nMOS transistor structures are being formed. For example, for pMOS structures, x may equal xp and for nMOS structures, x may equal xn. Accordingly, the values of xp and xn may be selected to achieve desired final concentrations of Si and Ge in self graded $Si_{1-y}Ge_y$ fins for pMOS structures and $Si_{1-z}Ge_z$ fins for nMOS structures. In one embodiment, xp may be in the range of about 0.10 to about 0.30 and xn may be in the range of about 0.05 to about 0.20.

Both pMOS and nMOS transistor structures may be grown at similar temperatures and relatively low pressures. In an embodiment, the epitaxial growth may be at temperatures in the range of about 700° C. to about 900° C. and at pressures less than about 100 torr. During the formation of pMOS transistor structures, nMOS fins may be protected with a nitride mask (not shown). Likewise, during formation of nMOS transistor structures, pMOS fins may be protected with a nitride mask (not shown).

An optional Si cap (not shown) may be grown on top of the $Si_{1-x}Ge_x$ layer 130 as a sacrificial oxidation layer. The Si cap may prevent Ge loss during an initial stage of a Ge confinement oxidation process. The optional Si cap may be formed by low pressure CVD. In an embodiment, growth conditions for the Si cap may include temperatures between about 500° C. and about 700° C. and pressures less than about 100 torr.

Figure 1C:
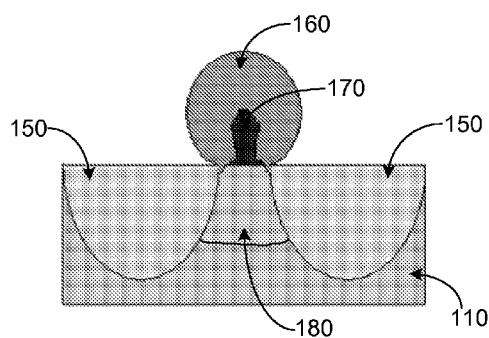

FIG. 1C illustrates a preferential oxidation step that may include Ge confinement and selective Si oxidation. Si may be predominantly consumed. Ge may be forced into the center of the Si fin 140. In an embodiment, the preferential oxidation step may include thermal oxidation in a relatively dry $O_2$ ambient at temperatures, for example, between about 900° C. and about 1000° C. During this step, Si from both fin 140 and layer 130 may be preferentially oxidized, i.e., may combine with ambient $O_2$ to form $SiO_2$ (Silicon dioxide) layer 160. Also during this step, Ge from layer 130, may be forced into fin 140 as Si is consumed to form strain-inducing $Si_{1-w}Ge_w$ fin 170 and may then diffuse towards the Si substrate 110 to form transition region 180. Strain-inducing $Si_{1-w}Ge_w$ fin 170 and transition region 180 may therefore be self-graded. Accordingly, this step may yield $Si_{1-w}Ge_w$ fin 170, transition region 180 and a volume of $SiO_2$ 160.

Figure 1D:
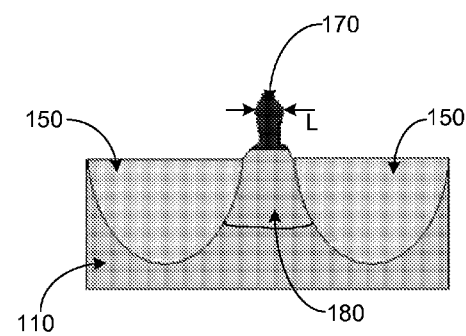

The final width of the $Si_{1-w}Ge_w$ fin 170 may be adjusted by adjusting the amount of oxidation. In an embodiment, the $Si_{1-w}Ge_w$ fin 170 may have a final width, L, of less than about 30 nm. In another embodiment, the $Si_{1-w}Ge_w$ fin 170 may have a final width, L, of less than about 15 nm. The $SiO_2$ may then be removed. In an embodiment, the $SiO_2$ 160 may then be removed by a hydrofluoric acid wet etch. FIG. 1D depicts the $Si_{1-w}Ge_w$ fin 170 with the surface $SiO_2$ (e.g., 160 of FIG. 1C) removed.

Different oxidation conditions may be separately applied to the pMOS and nMOS structures through the use of a nitride mask (not shown). In general, pMOS structures may be oxidized prior to oxidation of nMOS structures. During the oxidation of the pMOS structures, the nMOS structures may be protected with a nitride mask. pMOS structures may be oxidized at relatively higher temperatures than nMOS structures. The nitride mask may then be removed and the nMOS structures may then be oxidized.

The desired relative concentrations of Si and Ge of the final $Si_{1-w}Ge_w$ fin 170 may depend on the desired strain and the materials selected for the active channel layer. The value of w may further depend on whether pMOS or nMOS transistor structures are being formed. The final relative concentrations of Si and Ge in $Si_{1-w}Ge_w$ fin 170 may depend on the relative concentrations of Si and Ge (i.e., 1-x and x) and the thickness of the $Si_{1-x}Ge_x$ epitaxial layer 130 that was grown on the Si fin 140. The final relative concentrations of Si and Ge in $Si_{1-w}Ge_w$ fin 170 may also depend on the amount of oxidation. In one embodiment, for pMOS structures, this step may yield a $Si_{1-y}Ge_y$ fin 170 (i.e., w=y) where y may be greater than about 60%. In another embodiment, for nMOS structures this step may yield a $Si_{1-z}Ge_z$ fin 170 (i.e., w=z) where z may be less than about 40%. In another embodiment, for pMOS structures, this step may yield a $Si_{1-y}Ge_y$ fin 170 where y may be in the range of about 60% to about 90%. In another embodiment, for nMOS structures, this step may yield a $Si_{1-z}Ge_z$ fin 170 where z may be in the range of about 10% to about 40%.

Figure 2:
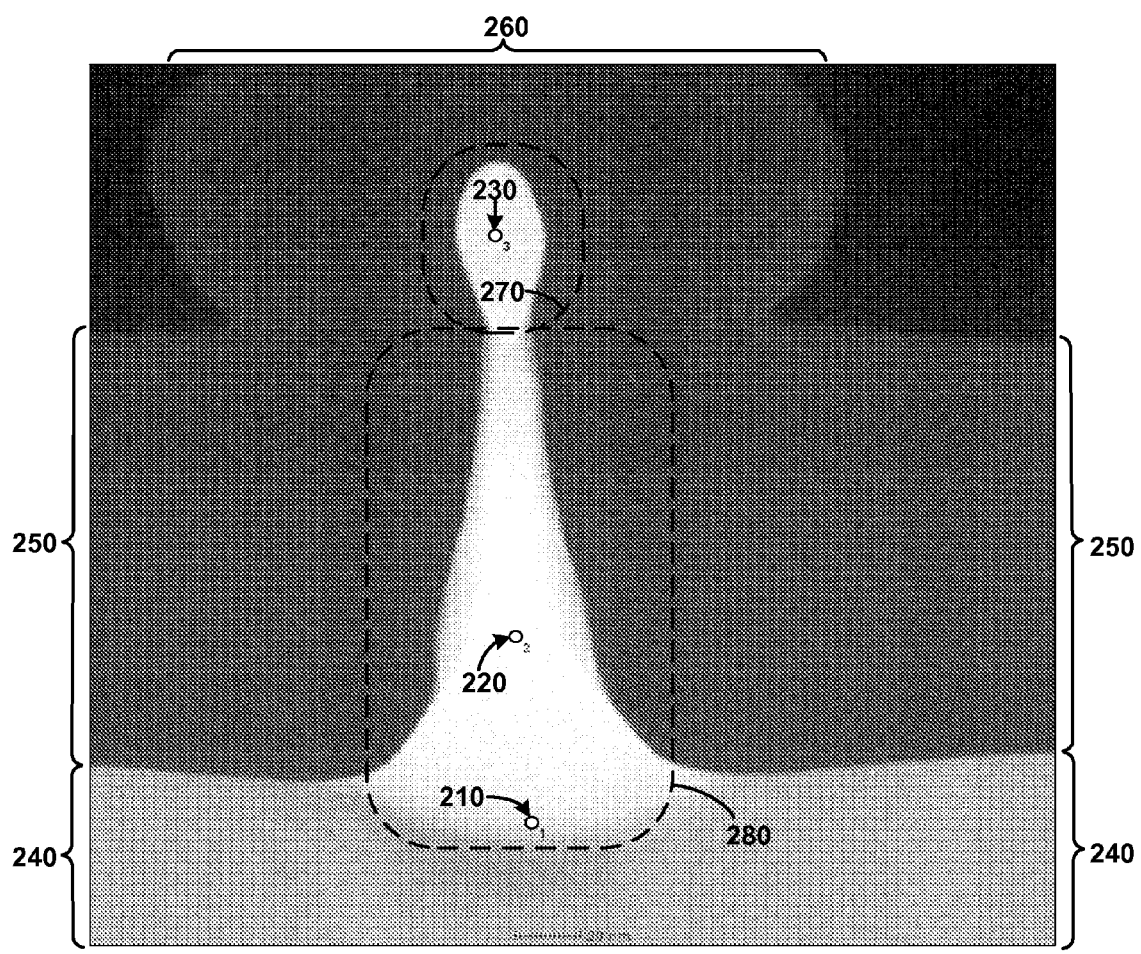
FIG. 2 depicts an exemplary TEM image of a structure consistent with the present disclosure.

FIG. 2 depicts an exemplary TEM (transmission electron micrograph) of a $Si_{1-y}Ge_y$ fin 270 (e.g., $Si_{1-w}Ge_w$ fin 170 of FIG. 1C with w=y) and a transition region 280 (e.g., transition region 180 of FIG. 1C) on a Si substrate 240. FIG. 2 corresponds to the process step depicted, for example, in FIG. 1C. The $Si_{1-y}Ge_y$ fin 270 may extend above a shallow trench isolation region 250. In an embodiment, the shallow trench isolation region may be $SiO_2$. The $Si_{1-y}Ge_y$ fin 270 may be surrounded by a $SiO_2$ layer 260 as a result of a preferential Si oxidation process.

It may be appreciated that the $Si_{1-y}Ge_y$ fin 270 may have relatively more rounded corners as compared to, for example, the Si fin 140 depicted in FIGS. 1A and 1B. The relatively more rounded corners of the $Si_{1-y}Ge_y$ fin 270 may illustrate a smoothing effect that may reduce surface roughness. The smoothing effect may be the result of a relatively high temperature preferential Si oxidation process, for example, as discussed above.

Figure 3A:
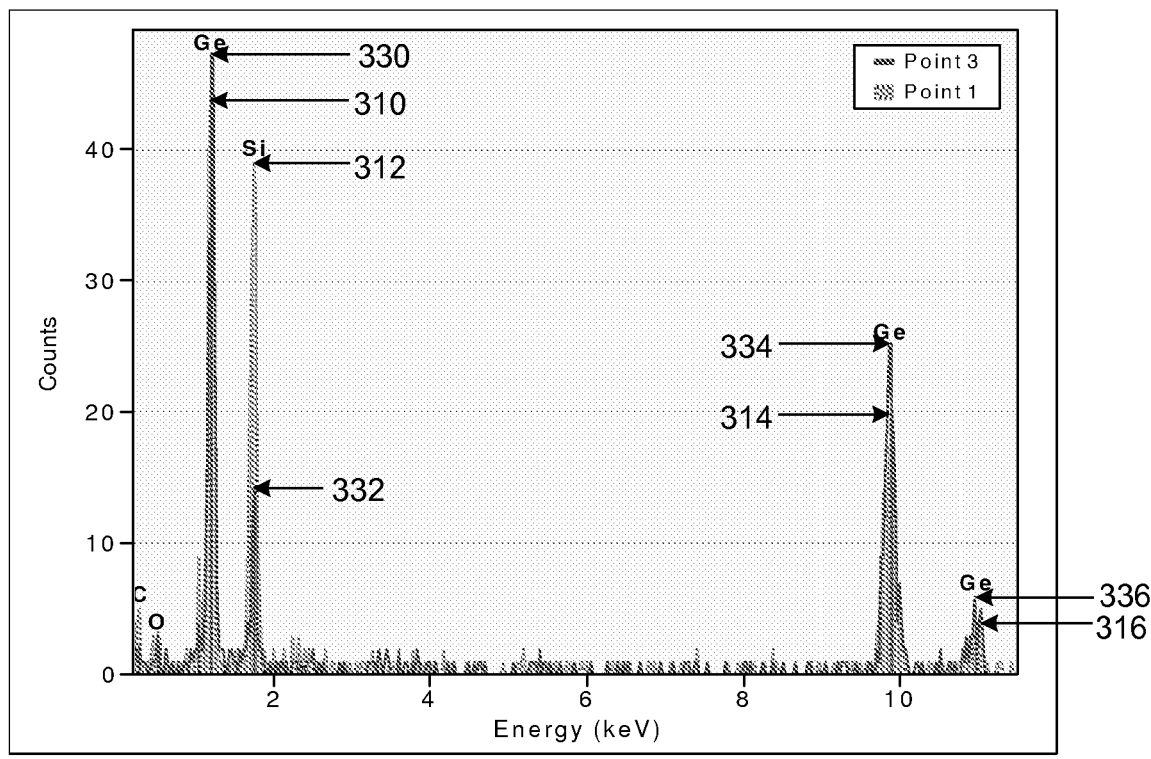
FIGS. 3A and 3B depict exemplary EDX plots representing examples of Si and Ge concentrations corresponding to points 1, 2 and 3 of the TEM image of FIG. 2.
Figure 3B:
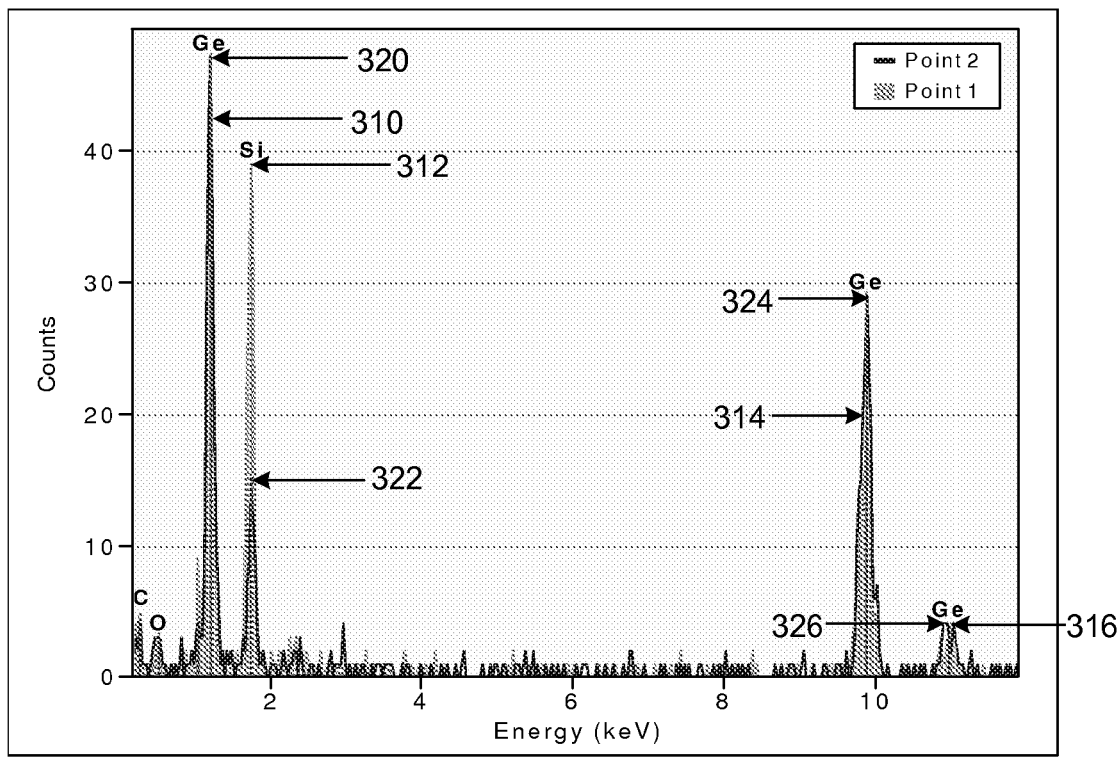

FIGS. 3A and 3B depict exemplary EDX (energy dispersive x-ray spectrograph) plots corresponding to point 1 210, point 2 220 and point 3 230 (Points 1, 2, and 3, respectively) on fin 270 and transition region 280 of FIG. 2. An EDX plot may illustrate relative concentrations of materials at a selected location in a structure. The area or the sum of the areas under a count peak or peaks corresponding to an element of interest, e.g., Si or Ge, may correspond to a relative concentration of that element.

FIG. 3A depicts EDX data for Si and Ge for point 1 210 and point 3 230. Point 1 in FIG. 3A corresponds to point 1 210 of FIG. 2 and Point 3 in FIG. 3A corresponds to point 3 230 of FIG. 2. Comparison of EDX data for Point 1, e.g., peak values 310, 312, 314 and 316, and EDX data for Point 3, e.g., peak values 330, 332, 334 and 336, may illustrate greater Ge concentration at Point 3, e.g., peak values 330, 334 and 336, than at Point 1, e.g., peak values 310, 314 and 316, and greater Si concentration at Point 1, e.g., peak value 312, than at Point 3, e.g., peak value 332.

Similarly, FIG. 3B depicts EDX data for Si and Ge for point 1 210 and point 2 220. Point 1 in FIG. 3B corresponds to point 1 210 of FIG. 2 and Point 2 in FIG. 3B corresponds to point 2 220 of FIG. 2. Comparison of EDX data for Point 1, e.g., peak values 310, 312, 314 and 316, and EDX data for Point 2, e.g., peak values 320, 322, 324 and 326, may illustrate greater Ge concentration at Point 2, e.g., peak values 320, 324 and 326 than at Point 1, e.g., peak values 310, 314 and 316, and greater Si concentration at Point 1, e.g., peak value 312 than at Point 2, e.g., peak value 322.

In an embodiment, relative concentrations of Si and Ge for a pMOS fin (e.g., $Si_{1-y}Ge_y$ fin 270) and a transition region (e.g., transition region 280) may be $Si_{0.50}Ge_{0.50}$ for Point 1, 210, $Si_{0.25}Ge_{0.75}$ for Point 2, 220 and $Si_{0.20}Ge_{0.80}$ for Point 3, 230. These relative concentrations may illustrate graded Ge concentrations over the $Si_{1-y}Ge_y$ fin 270 and transition region 280. The change in relative concentrations may not be constant over the $Si_{1-y}Ge_y$ fin 270 and transition region 280. The Ge concentration of the $Si_{1-y}Ge_y$ fin 270 may be about equivalent to the Ge concentration at Point 3, 230. The $Si_{1-y}Ge_y$ fin 270 may then provide a relatively more uniform strain.

The Ge concentration may be relatively greater near the top of the transition region 280, e.g., 80% near point 230, and relatively smaller near the bottom of the transition region 280, e.g., 50% at point 210. Such a change in Ge concentration may reduce the incidence of dislocation defects that may exist near the interface of the Si substrate 240 and the transition region 280. In other words, the lattice constant of the transition region 280 may be relatively more closely matched to the lattice constant of the Si substrate 240 near the Si substrate. Away from the substrate, e.g., near the $Si_{1-y}Ge_y$ fin 270, where the Ge concentration may be at or near its maximum, the lattice constant may be relatively more closely matched to the lattice constant of Ge. The grading may also reduce the propagation of dislocation defects.

Figure 4A:
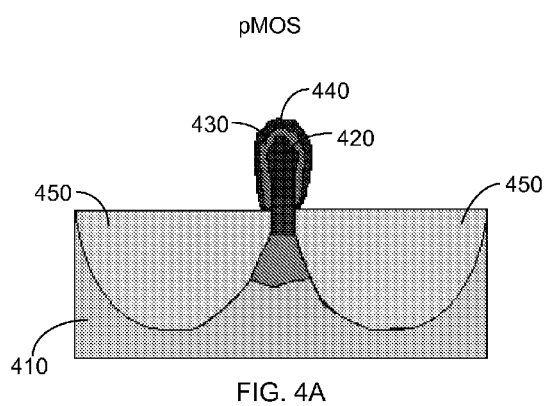
FIGS. 4A and 4C depict end-view cross-sections of exemplary pMOS 3D fin structures and FIGS. 4B and 4D depict end-view cross-sections of exemplary nMOS 3D fin structures, consistent with the present disclosure.
Figure 4B:
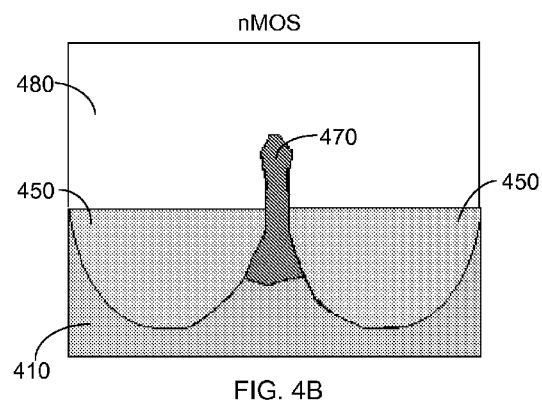
Figure 4C:
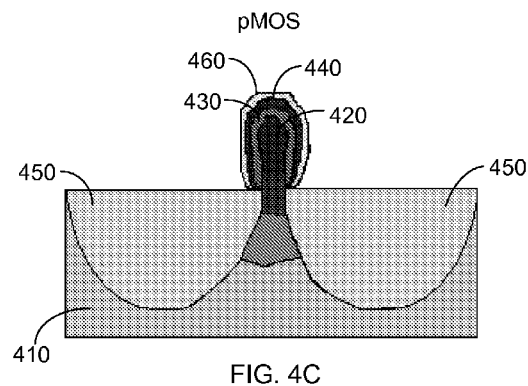
Figure 4D:
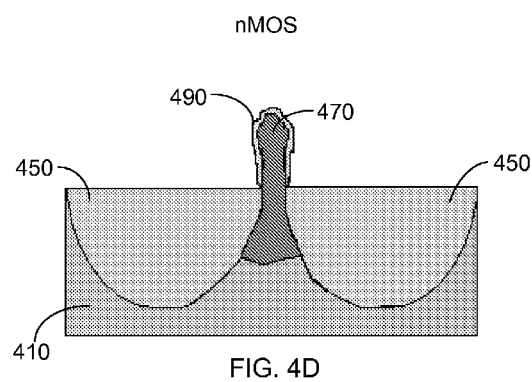

FIGS. 4A through 4D depict further process steps for forming pMOS and nMOS transistor structures on graded fins, e.g., $Si_{1-w}Ge_w$ fin 170 of FIG. 1D. FIGS. 4A and 4B depict parallel process conditions for pMOS and nMOS transistor structures, respectively. FIGS. 4C and 4D depict parallel process conditions for pMOS and nMOS transistor structures, respectively. In the embodiments depicted in FIGS. 4A through 4D, fins 420, 470 have been grown on an Si substrate 410 and may be separated from adjacent fins 420, 470 by shallow trench isolation regions 450. As discussed above, while single fins 420, 470 are shown, multiple pMOS fins 420 or multiple nMOS fins 470 may be processed in parallel. Single fins 420, 470 are shown for simplicity.

Referring to FIG. 4A, a Ge active channel layer, e.g., Ge quantum well 430, may be grown to a final thickness on a $Si_{1-y}Ge_y$ pMOS fin 420 by selective epitaxy. In one embodiment, growth temperatures may be between about 300° C. and about 600° C. In an embodiment, the Ge quantum well 430 may have a final thickness between about 5 nm and about 10 nm, for example. A relatively thin $Si_{1-y}Ge_y$ upper quantum well barrier layer 440 may then be grown epitaxially on the Ge quantum well 430. In an embodiment, growth temperatures may be in the range of about 400 C to about 800 C and growth pressures may be less than about 100 torr. The $Si_{1-y}Ge_y$ upper quantum well barrier layer 440 may have a final thickness between about 2 nm and about 6 nm, for example. During the growth of the Ge quantum well 430 and the $Si_{1-y}Ge_y$ upper quantum well barrier layer 440 on pMOS fins 420, nMOS fins (e.g., fin 470 of FIG. 4B) may be isolated by an oxide mask 480. The oxide mask 480 may then be removed with an etching process, e.g., a hydrofluoric acid etch.

Referring to FIG. 4D, a relatively thin Si channel 490 may be epitaxially grown on a $Si_{1-z}Ge_z$ nMOS fin 470 at relatively low pressures. In one embodiment, the Si channel 490 may be grown at temperatures between about 500° C. and about 700° C., at pressures less than about 100 torr and may be grown to a final thickness in the range of about 2 nm to about 10 nm. A relatively thin Si cap, e.g., cap 460 of FIG. 4C, may be epitaxially grown on the $Si_{1-y}Ge_y$ upper quantum well barrier layer 440 of pMOS fin 420. The Si cap 460 may be grown under growth conditions similar to the growth conditions for the Si channel 490 and may have a similar final thickness.

Figure 4E:
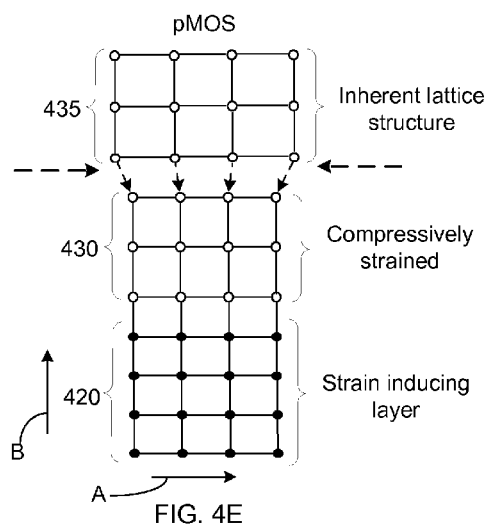
FIGS. 4E and 4G depict side-view cross-sections of exemplary pMOS 3D fin structures and FIGS. 4F and 4H depict side-view cross-sections of exemplary nMOS 3D fin structures, consistent with the present disclosure.
Figure 4F:
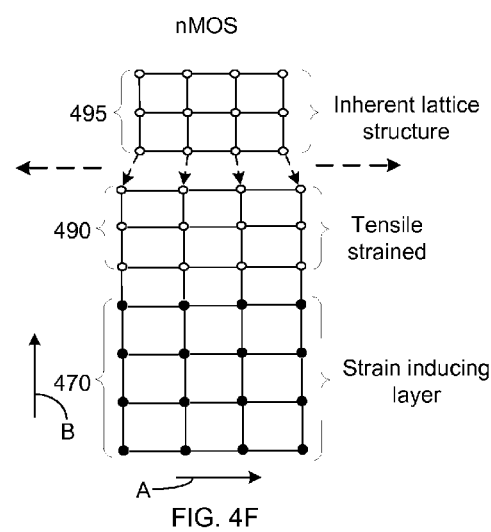
Figure 4G:
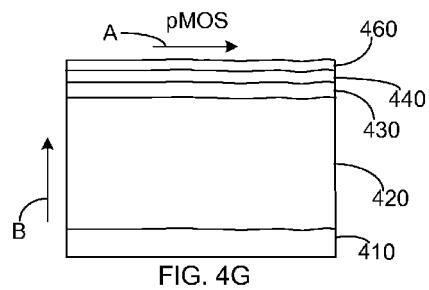
Figure 4H:
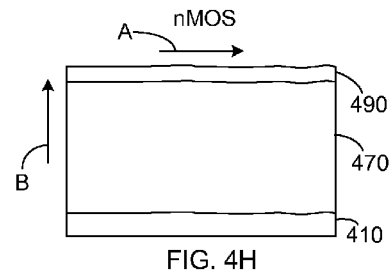

FIGS. 4E and 4F depict highly simplified two dimensional lattice structures for compressively strained pMOS and tensile strained nMOS fin structures, respectively. The drawn scale is arbitrary. FIGS. 4G and 4H depict side-view cross-sections of pMOS and nMOS fins, respectively. As with FIGS. 4E and 4F, the drawn scale is arbitrary. The views of FIGS. 4G and 4H correspond to the views of the lattice structures depicted in FIGS. 4E and 4F, respectively. Like components have like reference designators. The arrows labeled "A" show a fin long axis direction. The arrows labeled "B" show a direction normal to a surface of the fins.

In some embodiments, e.g., pMOS transistor structures, y may be in the range of about 60% to about 90%. As discussed above, Si may have a lattice constant of about 5.431 Å and Ge may have a lattice constant of about 5.658 Å (e.g., 435, FIG. 4E). A $Si_{1-y}Ge_y$ pMOS fin, e.g., fin 420, may therefore have a lattice constant between about 5.566 Å and about 5.633 Å. Accordingly, a Ge quantum well 430 may be compressively strained by the $Si_{1-y}Ge_y$ pMOS fin 420. In one embodiment, the compressive strain in the Ge quantum well 430 may be about 1.0% for a $SiO_{0.2}Ge_{0.8}$ fin (i.e., y=about 80%) and in another embodiment, about 1.7% for a $Si_{0.4}Ge_{0.6}$ fin (i.e., y=about 60%).

The compressive strain in the Ge quantum well 430 may be uniaxial, e.g., in the direction of the dotted arrows parallel to arrow A in FIG. 4E. The compressive strain in the Ge quantum well 430 may be parallel to a long axis of the $Si_{1-y}Ge_y$ pMOS fin 420, i.e., parallel to arrow A in FIG. 4G and into the page in the sense of FIG. 4A. The long axis of the $Si_{1-y}Ge_y$ pMOS fin 420 may be along the [110] direction. The Ge quantum well 430 may have a lattice structure in a direction parallel to arrow A that is strained to match to the lattice structure of the $Si_{1-y}Ge_y$ pMOS fin 420.

The Ge quantum well 430 may further have lattice structures in the normal to the $Si_{1-y}Ge_y$ pMOS fin 420 surface directions (e.g., parallel to arrow B). These lattice structures may be tensile strained near the Ge quantum well 430—$Si_{1-y}Ge_y$ pMOS fin 420 interface (not shown). The magnitude of the strain may depend on the magnitude of the compressive strain in the Ge quantum well 430 and the Poisson's ratio for Ge. Away from the Ge quantum well 430—$Si_{1-y}Ge_y$ pMOS fin 420 interface, these lattice structures may be relaxed to their bulk Ge values because of the three dimensional nature of the fin structure. Similarly, the lattice structure perpendicular to the $Si_{1-y}Ge_y$ pMOS fin 420 long axis (i.e., perpendicular to arrow A) and parallel to $Si_{1-y}Ge_y$ pMOS fin 420 surface directions (e.g., perpendicular to arrow B) may also be relaxed because of the small number of atoms participating in the strain and the relatively larger surface area of the three dimensional fin edges and corners. This combination of lattice matching in one direction and relaxation in the other directions may provide uniaxial compressive strain in the Ge quantum well 430. This compressive strain may increase hole mobility in a pMOS transistor structure that includes the Ge quantum well 430.

In some embodiments, e.g., nMOS transistor structures, z may be in the range of about 10% to about 40%. As discussed above, Si may have a lattice constant of about 5.431 Å and Ge may have a lattice constant of about 5.658 Å (e.g., 495, FIG. 4F). An $Si_{1-z}Ge_z$ nMOS fin, e.g., fin 470, may therefore have a lattice constant between about 5.451 Å and about 5.517 Å. Accordingly, the Si active channel layer 490 may be tensile strained by the $Si_{1-z}Ge_z$ nMOS fin 470. In one embodiment, the tensile strain in the Si active channel layer 490 may be about 0.37% for a $Si_{0.9}Ge_{0.1}$ fin (i.e., z=about 10%) and in another embodiment about 1.15% for a $Si_{0.7}Ge_{0.3}$ fin (i.e., z=about 30%).

The tensile strain in the Si active channel layer 490 may be uniaxial, e.g., in the direction of the dotted arrows parallel to arrow A in FIG. 4F. The tensile strain in the Si active channel layer 490 may be parallel to a long axis of the $Si_{1-z}Ge_z$ nMOS fin 470, i.e., parallel to arrow A in FIG. 4H and into the page in the sense of FIG. 4B. The long axis of the $Si_{1-z}Ge_z$ nMOS fin 470 may be along the [110] direction. The Si active channel layer 490 may have a lattice structure in a direction parallel to arrow A that is matched to the lattice structure of the $Si_{1-z}Ge_z$ nMOS fin 470.

The Si active channel layer 490 may further have lattice structures, in the normal to the $Si_{1-z}Ge_z$ nMOS fin 470 surface directions (e.g., parallel to arrow B). These lattice structures may be compressively strained near the Si active channel layer 490—$Si_{1-z}Ge_z$ nMOS fin 470 interface (not shown). The magnitude of the strain may depend on the magnitude of the tensile strain in the Si active channel layer 490 and the Poisson's ratio for Si. Away from the Si active channel layer 490—$Si_{1-z}Ge_z$ nMOS fin 470 interface, these lattice structures may be relaxed to their bulk Si values because of the three dimensional nature of the fin structure. Similarly, the lattice structure perpendicular to the $Si_{1-z}Ge_z$ nMOS fin 470 long axis (i.e., perpendicular to arrow A) and parallel to $Si_{1-z}Ge_z$ nMOS fin 470 surface directions (e.g., perpendicular to arrow B) may also be relaxed because of the small number of atoms participating in the strain and the relatively larger surface area of the three dimensional fin edges and corners. This combination of lattice matching in one direction and relaxation in the other directions may provide uniaxial tensile strain in the Si active channel layer 490. This tensile strain may increase electron mobility in an nMOS transistor structure that may include the Si active channel layer 490.

After the transistor structures depicted in FIGS. 4C and 4D, for example, have been formed, high-k gate dielectric layers and metal gates that form a three dimensional structure may be grown on the active channel regions on the transistor structures. For example, the high-k dielectric layers and the metal gates may be formed by atomic layer deposition at temperatures in the range of about 300° C. to about 500° C. Spacers (e.g., nitride) may be formed using chemical vapor deposition, for example. Source and drain regions may be formed by ion implantation. Tungsten contacts, for example, may be formed by chemical vapor deposition. Chemical vapor deposition may also be used to form interlayer isolation. Interconnections (e.g., copper) may also be formed.

pMOS transistor structures, e.g., the transistor structure shown in FIG. 4C and nMOS transistor structures, e.g., the transistor structure shown in FIG. 4D, may be integrated to form relatively high performance CMOS devices. In other embodiments, either pMOS transistor structures, e.g., the transistor structure shown in FIG. 4C or nMOS transistor structures, e.g., the transistor structure shown in FIG. 4D, may be integrated separately into a conventional Si channel CMOS flow.

In other embodiments, other relatively high mobility materials may be used to form strained active channel layers. Relatively high mobility materials may include III-V semiconductors such as GaAs, InSb and InGaAs. For example, self graded SiGe fins (e.g., $Si_{1-w}Ge_w$ fin 170, FIG. 1D) may be used to induce desired strain in active channel layers. It may be appreciated that the amount of strain may be adjusted by adjusting the relative concentrations of Si and Ge in a strain inducing fin. For example, referring again to FIG. 1B, the parameter x, the Ge concentration of the $Si_{1-x}Ge_x$ layer 130, may be adjusted to achieve desired relative concentrations of Si and Ge in a strain inducing fin such as $Si_{1-w}Ge_w$ fin 170 of FIG. 1D. The desired relative concentrations of Si and Ge may depend on the material used for the active channel layer as well as the desired strain in the active channel layer. Accordingly, a self graded strain inducing $Si_{1-w}Ge_w$ fin may be used with active channel layer materials other than Si and/or Ge.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A method of forming a semiconductor device on an Si substrate, said method comprising:
    forming a Si fin structure on said Si substrate, by protecting with photoresist a portion of said Si substrate where said Si fin structure is to be formed and etching away adjacent regions of said Si substrate;
    growing a layer of oxide on said Si fin structure and said Si substrate;
    exposing at least a portion of said Si fin structure by mechanically or chemically polishing said oxide layer to a top surface of said Si fin structure and recessing said oxide layer adjacent said Si fin structure;
    epitaxially growing a $Si_{1-x}Ge_x$ layer on said exposed portion of said Si fin structure wherein said $Si_{1-x}Ge_x$ layer has a first Ge concentration, x; and
    preferentially oxidizing Si from said $Si_{1-x}Ge_x$ layer and from said Si fin structure into $SiO_2$ wherein Si is predominantly consumed and Ge is forced into said Si fin structure resulting in a $Si_{1-w}Ge_w$ fin structure having a maximum second Ge concentration, w, and a width.

2. The method of claim 1 wherein:
    said first Ge concentration, x, is in the range of about 10% to about 30%.

3. The method of claim 1 wherein:
    said first Ge concentration, x, is in the range of about 5% to about 20%.

4. The method of claim 3 wherein:
    said maximum second Ge concentration is in the range of about 10% to about 40%.

5. The method of claim 4, further comprising:
    selectively epitaxially growing an active channel layer on said $Si_{1-w}Ge_w$ fin structure wherein said active channel layer is uniaxially tensile strained.

6. The method of claim 1 wherein:
    said maximum second Ge concentration is in the range of about 60% to about 90%.

7. The method of claim 6, further comprising:
    selectively epitaxially growing a quantum well on said $Si_{1-w}Ge_w$ fin structure wherein said quantum well is uniaxially compressively strained; and
    epitaxially growing a $Si_{1-w}Ge_w$ upper quantum well barrier layer on said quantum well.

8. The method of claim 7 further comprising epitaxially growing an Si cap on said $Si_{1-w}Ge_w$ upper quantum well barrier layer.

9. The method of claim 1 wherein said width is less than about 30 nm.

* * * * *